(12) United States Patent
Jiang et al.

(10) Patent No.: US 12,222,465 B1
(45) Date of Patent: Feb. 11, 2025

(54) ROCKET APPARATUS AND METHOD FOR CHANGING ELECTRICAL ENVIRONMENT IN THUNDERSTORM CLOUD

(71) Applicant: Institute of Atmospheric Physics, CAS, Beijing (CN)

(72) Inventors: Rubin Jiang, Beijing (CN); Xiushu Qie, Beijing (CN); Hongbo Zhang, Beijing (CN); Ruiling Chen, Beijing (CN); Yufan Ren, Beijing (CN); Kun Liu, Beijing (CN); Mingyuan Liu, Beijing (CN); Dongxia Liu, Beijing (CN); Dongfang Wang, Beijing (CN); Yuejian Xuan, Beijing (CN); Xiang'ao Xia, Beijing (CN)

(73) Assignee: Institute of Atmospher ic Physics, CAS, Beijing (CN)

( * ) Notice: Subject to any disclaimer, the term of this patent is extended or adjusted under 35 U.S.C. 154(b) by 0 days.

(21) Appl. No.: 18/743,945

(22) Filed: Jun. 14, 2024

(30) Foreign Application Priority Data

Sep. 12, 2023 (CN) .......................... 202311173561.7

(51) Int. Cl.
*G01W 1/08* (2006.01)
*G01R 29/08* (2006.01)
*G01W 1/16* (2006.01)
*G01W 1/00* (2006.01)

(52) U.S. Cl.
CPC .......... *G01W 1/08* (2013.01); *G01R 29/0842* (2013.01); *G01W 1/16* (2013.01); *G01W 2001/006* (2013.01)

(58) Field of Classification Search
CPC ... G01W 1/08; G01W 1/16; G01W 2001/006; G01R 29/0842
See application file for complete search history.

(56) References Cited

U.S. PATENT DOCUMENTS 3,101,052 A * 8/1963 Webster .................. F42B 10/56
102/378
2002/0101700 A1 * 8/2002 Betts ...................... H02G 13/20
361/230

(Continued)

OTHER PUBLICATIONS

Stéphane (Developing an In-Flight Lightning Strike Damage Assessment System) (Year: 2007).*

*Primary Examiner* — Catherine T. Rastovski
*Assistant Examiner* — Sharad Timilsina
(74) *Attorney, Agent, or Firm* — Suiter Swantz IP

(57) ABSTRACT

The present application provides a rocket apparatus and a method for changing an electrical environment in a thunderstorm cloud. A corona probe and an atmospheric electric field detector analyzes and obtains, based on spin angular velocity information of a rocket and inclination attitude information of the rocket that are provided by a gravity gyroscope, accurate strength of a three-dimensional electric field and accurate polarity of a charge in the thunderstorm cloud. A charge-neutralizing agent module externally releases a charged agent whose polarity is opposite to the charge in the thunderstorm cloud, to consume the charge in the thunderstorm cloud via neutralization between a heterocharge carried by the charged agent and the charge in the thunderstorm cloud.

8 Claims, 6 Drawing Sheets

(56) References Cited

U.S. PATENT DOCUMENTS

| | | | |
|---|---|---|---|
| 2010/0220424 A1* | 9/2010 | Ibok | H05F 7/00 361/117 |
| 2013/0286203 A1* | 10/2013 | Lv | G01W 1/16 348/143 |
| 2014/0263830 A1* | 9/2014 | Canham | B64G 5/00 244/1 A |
| 2018/0226782 A1* | 8/2018 | Wang | H01T 4/02 |
| 2019/0031368 A1* | 1/2019 | Prakash | G01R 29/08 |
| 2021/0242931 A1* | 8/2021 | Swanson | G01W 1/16 |

* cited by examiner

A rocket spins

The rocket ascends at 500 m/s

Sow an agent

The rocket spins

FIG. 2

ROCKET APPARATUS AND METHOD FOR CHANGING ELECTRICAL ENVIRONMENT IN THUNDERSTORM CLOUD

CROSS REFERENCE TO RELATED APPLICATION

This patent application claims the benefit and priority of Chinese Patent Application No. 202311173561.7, filed with the China National Intellectual Property Administration on Sep. 12, 2023, the disclosure of which is incorporated by reference herein in its entirety as part of the present application.

TECHNICAL FIELD

The present discloses relates to the technical field of changing an electrical environment in a thunderstorm cloud, and in particular to a rocket apparatus and a method for changing an electrical environment in a thunderstorm cloud.

BACKGROUND

In terms of triggering lightning and discharge, an existing triggering-lightning rocket is mainly used for research on a physical process and mechanism of lightning and lightning effect. One end of a triggering-lightning and discharge conductor is fastened on the ground. Requirements for affecting an electrical environment in a thunderstorm cloud cannot be met due to several technical limitations:
  (1) Limited launching height of rocket (not more than 1 km) Lightning may be triggered near ground only when triggering-lightning conditions are achieved. If the conditions for triggering lightning are not achieved near the ground, but rather at the height of the cloud body or within the cloud, lightning cannot be triggered using the existing triggering-lightning rocket. In terms of a whole process of generation, development, maturation, dissipation of a thunderstorm, an existing time window for the operation of the triggering-lightning rocket and a region of thunderstorm cloud in which the operation takes place are limited, and there is no selectivity and controllability for a region to trigger lightning (especially the height of the triggering lightning).
  (2) When lightning is triggered near the ground (at a low altitude), the region in which charges in the thunderstorm cloud are released via triggered lightning is low, and charges in a higher region in the thunderstorm cloud cannot be released and affected.
  (3) One end of the conductor of the triggering-lightning rocket should be fixed to the ground. As a result, mobile and motorized triggering-lightning operations cannot be implemented. One end of the metal wire is fixed to the ground, requiring that a section of the wire to be extended from a spool to a fixing end in advance. As a result, the metal wire is exposed to the air and prone to rust and breakage. This affects the reliability of triggering-lightning operations.

In terms of neutralization and adjustment of charges in the thunderstorm cloud, a conventional technology proposes, based on numerical simulations and theoretical analysis, proposes that "thin metal foils are sown into the thunderstorm cloud that has been electrified and that carries rich charges, in order to release the charges in the thunderstorm cloud". However, the metal foil does not carry any electrical charges. The charges in the thunderstorm cloud are discharged by triggering small-scale discharges or by spanning heterocharged regions in the thunderstorm cloud. Therefore, there is a great deal of uncertainty.

In addition, an existing technical device for triggering lightning, and a concept for sowing metal foils to neutralize charges in the thunderstorm cloud roughly judge electrification and distribution state of charges in the thunderstorm cloud by means of limited remote sensing technologies (such as a ground-based atmospheric electric field detector and a radar), and operations are performed based on experience of an operator to a large extent. As a result, the electrical environment in a region in a thunderstorm cloud through which a rocket passes cannot be judged in real time, and it is impossible to accurately and effectively perform triggering-lightning for discharge or sow materials to neutralize the charge in the thunderstorm cloud.

Therefore, a rocket apparatus and a method for changing an electrical environment in a thunderstorm cloud are provided to resolve the above problems.

SUMMARY

An objective of the present disclosure is to provide a rocket apparatus and a method for changing an electrical environment in a thunderstorm cloud, to resolve the above problems.

The present disclosure adopts the following technical solutions to achieve the above objective:

A rocket apparatus for changing an electrical environment in a thunderstorm cloud includes:
  a rocket body;
  an atmospheric electric field detector;
  a charge-neutralizing agent module, configured to: generate and emit a positively/negatively charged agent, and neutralize a charge in the thunderstorm cloud;
  a controllable triggering-lightning and discharge module, configured to: trigger inter-cloud discharge, cloud-to-ground discharge, or cloud-to-air discharge, to consume the charge in the thunderstorm cloud; and
  a processing module, where a signal output end of the atmospheric electric field detector is connected to a signal input end of the processing module; a signal output end of the processing module is separately connected to a signal input end of the charge-neutralizing agent module and a signal input end of the controllable triggering-lightning and discharge module; and the atmospheric electric field detector, the charge-neutralizing agent module, the controllable triggering-lightning and discharge module, and the processing module are mounted on the rocket body.

Specifically, the charge-neutralizing agent module includes agent compartments, charge compartments, fans, mesh plates, and a power supply and control assembly; the agent compartments are disposed on upper sides of the charge compartments, and the fans are mounted at first ends of the charge compartments and configured to blow air to second ends of the charge compartments; the mesh plates are mounted in the second ends of the charge compartments, and controllable sowing funnels are disposed at the second ends of the charge compartments; chargeable charge agents are placed in the agent compartments, controllable release funnels are disposed between the agent compartments and the charge compartments, and the controllable release funnels are disposed between the fans and the mesh plates; the power supply and control assembly is electrically connected to the mesh plates, and configured to positively and negatively polarize the mesh plates; and the signal output end of the processing module is connected to a signal input end of the power supply and control assembly, and a signal output end of the power supply and control assembly is separately connected to signal input ends of the controllable sowing funnels, signal input ends of the controllable release funnels, and signal input ends of the fans.

Optimally, there are two agent compartments, two charge compartments, two fans, two mesh plates, two controllable release funnels, and two controllable sowing funnels, the two agent compartments and the two charge compartments are disposed in a same vertical direction, the two agent compartments are spaced apart, and the two mesh plates are respectively a positively polarized mesh plate and a negatively polarized mesh plate.

Further, the rocket apparatus for changing an electrical environment in a thunderstorm cloud further includes: a corona probe and a gravity gyroscope, where the corona probe is mounted on an outer portion of the rocket body, the gravity gyroscope is mounted inside the rocket body, and a signal output end of the corona probe and a signal output end of the gravity gyroscope are connected to the signal input end of the processing module.

Optimally, a wireless transmission module is disposed in the processing module, and the wireless transmission module is in wireless communication connection with a ground server.

Further, the rocket apparatus for changing an electrical environment in a thunderstorm cloud further includes a controllable triggering-lightning and discharge module, the controllable triggering-lightning and discharge module includes a pendant, a triggering-lightning and discharge conductor, and a release module configured to release the pendant, the pendant is connected to a first end of the triggering-lightning and discharge conductor, a second end of the triggering-lightning and discharge conductor is connected to a first end of an insulated wire, a second end of the insulated wire is fastened to the rocket body, the pendant is fastened to a bottom of the rocket body via the release module, and the signal output end of the processing module is connected to a signal input end of the release module.

Further, the rocket apparatus for changing an electrical environment in a thunderstorm cloud further includes: temperature, humidity, and pressure sensors, where the temperature, humidity, and pressure sensors are mounted on the rocket body, and signal output ends of the temperature, humidity, and pressure sensors are connected to the signal input end of the processing module.

Further, the rocket body includes a casing and a rocket motor, a parachute opening control terminal, configured to control opening of a parachute, a parachute compartment, and the parachute are disposed in the casing, the parachute is mounted in the parachute compartment, and the signal output end of the processing module is connected to a signal input end of the parachute opening control terminal.

Optimally, the atmospheric electric field detector includes: a first atmospheric electric field detector, a second atmospheric electric field detector, and a third atmospheric electric field detector, the first atmospheric electric field detector is mounted on a head of the casing, the second atmospheric electric field detector is mounted on an intermediate portion of the casing, and the third atmospheric electric field detector is mounted on a tail of the casing.

A method for changing an electrical environment in a thunderstorm cloud includes:

S1, launching a rocket into a thunderstorm cloud based on thunderstorm cloud detection data;

S2, after the rocket enters the thunderstorm cloud, performing, by a corona probe, corona discharge in a strong electric field environment, and detecting corona current strength, to obtain strength of the strong electric field environment based on a relationship between the corona current strength and the strength of the strong electric field environment, where an atmospheric electric field detector operates and analyzes, based on spin angular velocity information of the rocket and inclination attitude information of the rocket that are provided by a gravity gyroscope, the strength of the strong electric field environment, to obtain accurate strength of a three-dimensional electric field and accurate polarity of a charge in the thunderstorm cloud based on detection signals obtained by the corona probe and the atmospheric electric field detector;

S3, externally releasing, by a charge-neutralizing agent module based on the strength of the three-dimensional electric field and the polarity of the charge in the thunderstorm cloud, a charged agent whose polarity is opposite to the charge in the thunderstorm cloud, to consume the charge in the thunderstorm cloud via neutralization between a heterocharge carried by the charged agent and the charge in the thunderstorm cloud; releasing, by a release module in a controllable triggering-lightning and discharge module, a pendant at a preset time and position, stretching and unfolding a triggering-lightning and discharge conductor, to trigger inter-cloud discharge, cloud-to-ground discharge, or cloud-to-air discharge, and consume the charge in the thunderstorm cloud; and S4, determining, based on rocket detection data and ground detection data, whether a desired goal is achieved, where the desired goal is that density of local charges and electric field strength in a target region in the thunderstorm cloud are reduced below target values; if the desired goal is not achieved, further determining a follow-up operation plan based on the rocket detection data and the ground detection data, where the follow-up operation plan includes a launch direction of a rocket apparatus, a time and position of releasing the triggering-lightning and discharge conductor, and a time and position of releasing a charge-neutralizing agent; and repeating step S1 to step S4 until the desired goal is achieved.

The present disclosure has the following beneficial effects:

1. The corona probe and the atmospheric electric field detector analyze, based on the spin angular velocity information of the rocket and the inclination attitude information of the rocket that are provided by the gravity gyroscope, the strength of the strong electric field environment, to obtain the accurate strength of the three-dimensional electric field and the accurate polarity of the charge in the thunderstorm cloud based on detection signals obtained by the corona probe and the atmospheric electric field detector. A charge-neutralizing agent module externally releases a charged agent whose polarity is opposite to the charge in the thunderstorm cloud, to consume the charge in the thunderstorm cloud via neutralization between a heterocharge carried by the charged agent and the charge in the thunderstorm cloud. A control release module in a controllable triggering-lightning and discharge module releases a pendant at a preset time and position, stretches and unfolds a triggering-lightning and discharge conductor, to trigger inter-cloud discharge, cloud-to-ground discharge, or cloud-to-air discharge, and consume the charge in the thunderstorm cloud.

Therefore, within a specific period of time thereafter, conditions for generating lightning in the target region are significantly weakened, and probability of occurring lightning in the target area is significantly reduced.

2. Parameters of electric field strength, an atmospheric temperature, an atmospheric humidity, and an atmospheric pressure along the rocket's flight trajectory are continuously detected, and detection results are returned back to a ground console in real time. Therefore, intelligently integrated research and judgment are performed based on an electric field penetrating through the thunderstorm cloud, a temperature contour, a humidity contour, a pressure contour that are detected, and data such as a ground atmospheric electric field and a radar. This provides the basis for a launching angle and a launching direction of subsequent operations of an operating rocket, and charge polarity, a release time, and a release position of the charge-neutralizing agent.

BRIEF DESCRIPTION OF THE DRAWINGS

FIG. 2 is a schematic diagram 2 of a structure according to the present disclosure (after a rocket is launched, the rocket rises at a speed of 500 m/s, a conductor is released, and a charged agent is released);

Figure 1:
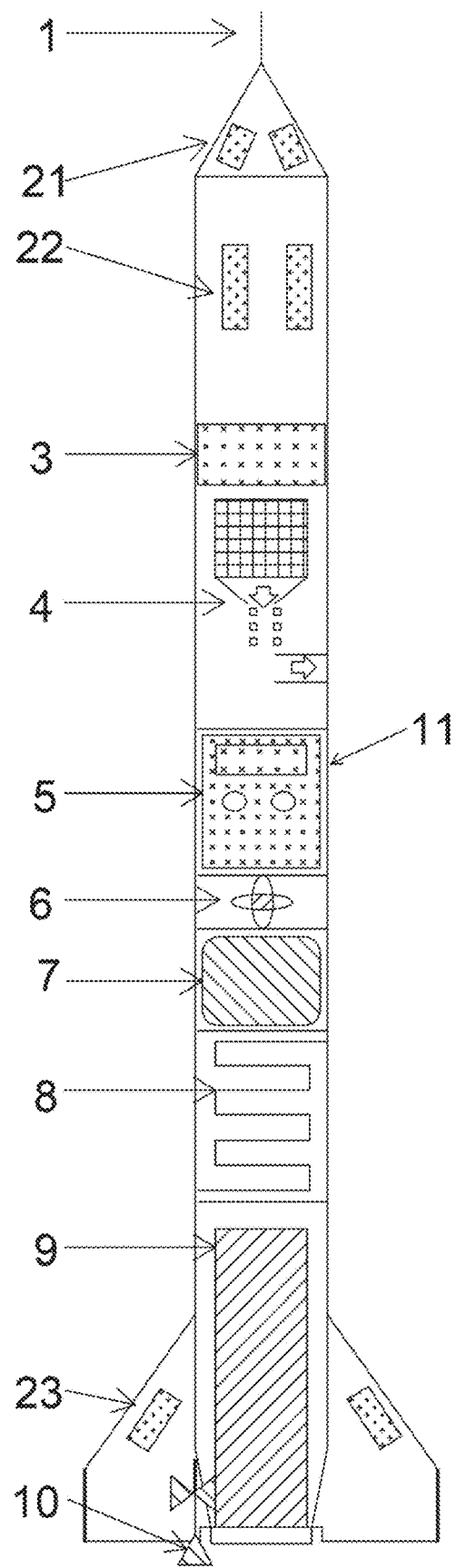
FIG. 1 is a schematic diagram 1 of a structure according to the present disclosure (a pendant is in a locked state before launching)

Reference numerals: 1, corona probe; 21, first atmospheric electric field detector; 22, second atmospheric electric field detector; 221, electric field induction sheet; 222, electric field shielding sheet; 223, driving motor; 23, third atmospheric electric field detector; 3, processing module; 4, charge-neutralizing agent module; 41, first agent compartment; 42, first charge compartment; 43, first controllable release funnel; 44, first controllable sowing funnel; 45, power supply and control assembly; 46, second agent compartment; 47, second charge compartment; 48, second controllable release funnel; 49, second controllable sowing funnel; 410, charged agent; 411, first fan; 412, first mesh plate; 413, second fan; 414, second mesh plate; 5, temperature, humidity, and pressure sensors; 6, gravity gyroscope; 7, parachute opening control terminal; 8, parachute compartment; 81, parachute; 9, rocket motor; 10, controllable triggering-lightning and discharge module; 101, pendant; 102, triggering-lightning and discharge conductor; 103, insulated wire; 11, casing.

DETAILED DESCRIPTION OF THE EMBODIMENTS

To make the objectives, technical solutions, and advantages of the embodiments of the present disclosure clearer, the technical solutions in the embodiments of the present disclosure are clearly and completely described below with reference to the accompanying drawings in the embodiments of the present disclosure. Apparently, the described embodiments are merely some rather than all of the embodiments of the present disclosure. Generally, components of the embodiments of the present disclosure described and shown in the accompanying drawings may be arranged and designed in various manners.

Therefore, the following detailed description of the embodiments of the present disclosure in the accompanying drawings is not intended to limit the protection scope of the present disclosure, but merely indicates selected embodiments of the present disclosure. All other embodiments obtained by those of ordinary skill in the art based on the embodiments of the present disclosure without creative efforts should fall within the protection scope of the present disclosure.

It should be noted that similar reference signs and letters represent similar items in the accompanying drawings below. Therefore, once an item is defined in one accompanying drawing, it does not need to be further defined and described in subsequent accompanying drawings.

In the description of the present disclosure, it should be understood that orientation or position relationships indicated by terms "upper", "lower", "inner", "outer", "left", "right", and the like are orientation or position relationships shown in the accompanying drawings, or usual orientation or position relationships of the products of the present disclosure when in use, or orientation or position relationships commonly understood by those skilled in the art. These terms are only used to facilitate description of the present disclosure and simplify the description, but not to indicate or imply that the mentioned device or component must have a specific orientation or must be established and operated in a specific orientation, and thus these terms cannot be understood as a limitation to the present disclosure.

In addition, the terms such as "first" and "second" are used only for distinguishing description and cannot be understood as indicating or implying relative importance.

In the description of the present disclosure, it should be noted that, unless otherwise clearly specified and limited, the terms "arranged" and "connected" should be understood in a broad sense. For example, the "connection" may be a fixed connection, a removable connection, or an integral connection; may be a mechanical connection or an electrical connection; may be a direct connection or an indirect connection through an intermediate medium; or may be intercommunication between two components. Those of ordinary skill in the art may understand specific meanings of the above terms in the present disclosure based on a specific situation.

The specific implementations of the present disclosure will be described in detail below with reference to the accompanying drawings.

Referring to FIG. 1 and FIG. 2, a rocket apparatus for changing an electrical environment in a thunderstorm cloud includes:

a rocket body;

an atmospheric electric field detector;

a charge-neutralizing agent module 4, configured to: generate and emit a positively/negatively charged agent, and neutralize a charge in the thunderstorm cloud;

a controllable triggering-lightning and discharge module 10, configured to: trigger inter-cloud discharge, cloudto-ground discharge, or cloud-to-air discharge, to consume the charge in the thunderstorm cloud; and a processing module 3, where a signal output end of the atmospheric electric field detector is connected to a signal input end of the processing module 3; a signal output end of the processing module 3 is separately connected to a signal input end of the charge-neutralizing agent module 4 and a signal input end of the controllable triggering-lightning and discharge module 10; and the atmospheric electric field detector, the charge-neutralizing agent module 4, the controllable triggering-lightning and discharge module 10, and the processing module 3 are mounted on the rocket body.

Figure 4:
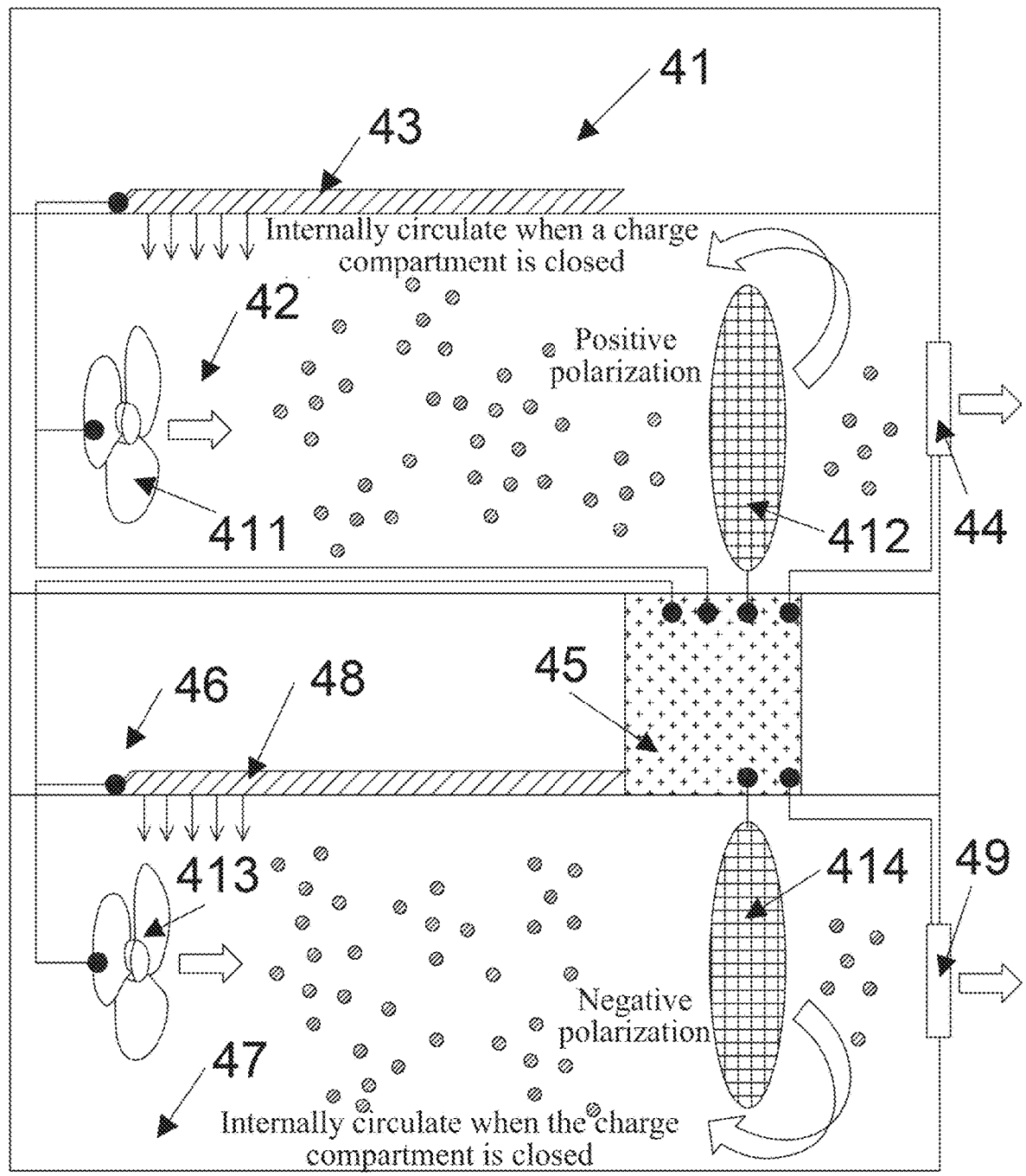
FIG. 4 is a schematic diagram of a structure of a charge-neutralizing agent module according to the present disclosure.

In some embodiments, referring to FIG. 4, the charge-neutralizing agent module 4 includes agent compartments, charge compartments, fans, mesh plates, and a power supply and control assembly 45. The agent compartments are disposed on upper sides of the charge compartments, and the fans are mounted at first ends of the charge compartments and configured to blow air to second ends of the charge compartments. The mesh plates are mounted in the second ends of the charge compartments, and controllable sowing funnels are disposed at the second ends of the charge compartments. Chargeable charge agents are placed in the agent compartments, controllable release funnels are disposed between the agent compartments and the charge compartments, and the controllable release funnels are disposed between the fans and the mesh plates. The power supply and control assembly 45 is electrically connected to the mesh plates, and configured to positively and negatively polarize the mesh plates. The signal output end of the processing module 3 is connected to a signal input end of the power supply and control assembly 45, and a signal output end of the power supply and control assembly 45 is separately connected to signal input ends of the controllable sowing funnels, signal input ends of the controllable release funnels, and signal input ends of the fans.

Figure 3:
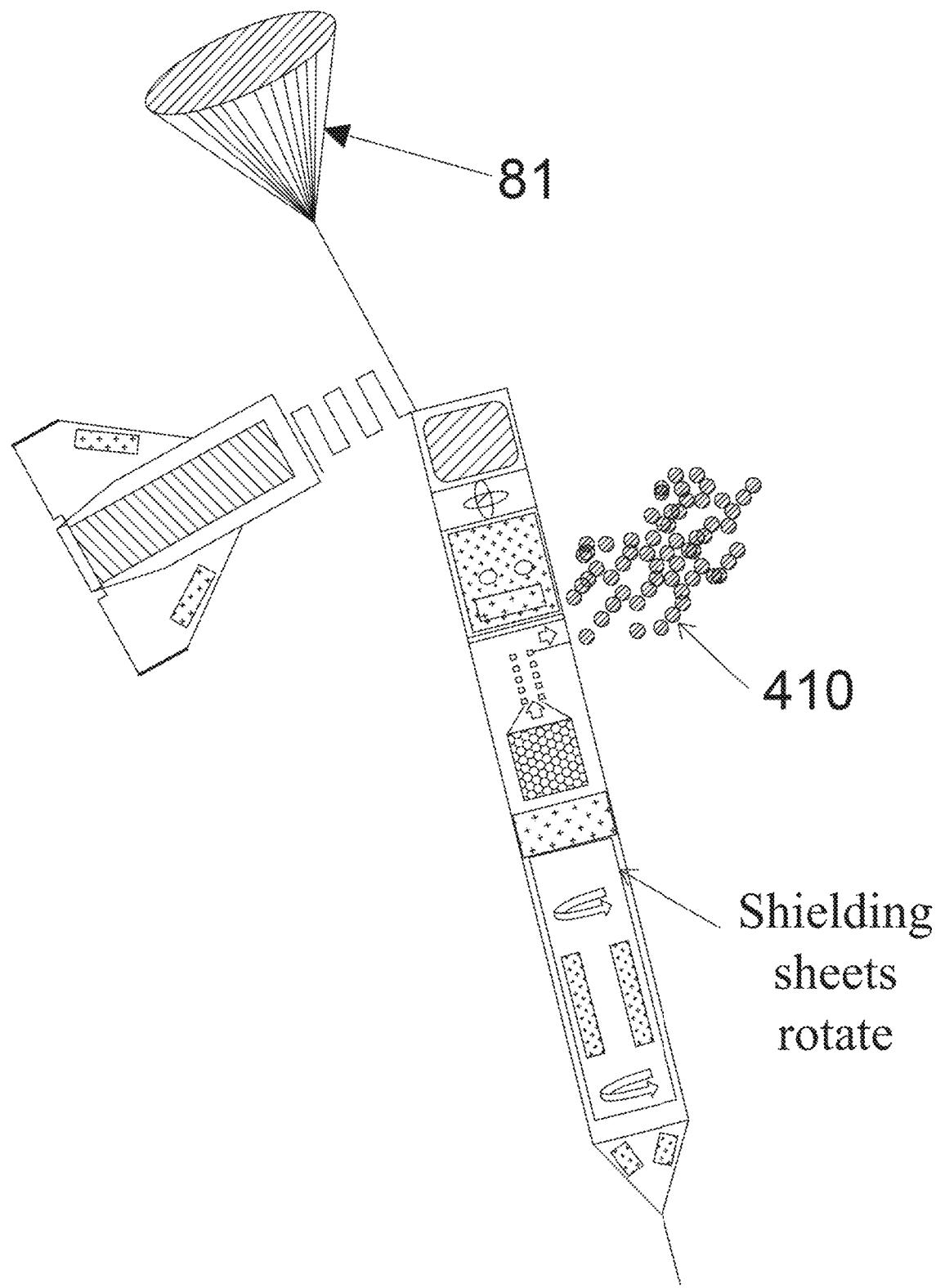
FIG. 3 is a schematic diagram 3 of a structure according to the present disclosure (after a parachute is opened, a rocket descends at a speed of 8 m/s, and a charged agent is released)

In some embodiments, referring to FIG. 3 and FIG. 4, the charge-neutralizing agent module 4 includes a first agent compartment 41, a first charge compartment 42, a first fan 411, a first mesh plate 412, a first controllable release funnel 43, a first controllable sowing funnel 44, a second agent compartment 46, a second charge compartment 47, a second fan 413, a second mesh plate 414, a second controllable release funnel 48, a second controllable sowing tunnel 49. The first agent compartment 41, the second agent compartment 46, the first charge compartment 42, and the second charge compartment 47 are disposed along a same vertical direction. The first agent compartment 41 and the second agent compartment 46 are spaced apart. The first mesh plate 412, and the second mesh plate 414 respectively corresponds to a positively polarized mesh plate and a negatively polarized mesh plate. The power supply and control assembly 45 operates, to enable the first mesh plate 412 and the second mesh plate 414 to be positively and negatively polarized. The chargeable charge agent (the chargeable charge agent is preferably a powdered/filamentary metal material) enters the charge compartment from the controllable release funnel, and the chargeable charge agent circulates in the charge compartment under action of the fan, and carries a positively polarized charge and a negatively polarized charge after the chargeable charge agent passes through the first mesh plate 412 and the second mesh plate 414. Polarity of a charge in the thunderstorm cloud in a target operation region is determined based on a real-time electric field detection result. The power supply and control assembly 45 opens the controllable sowing funnels that polarity is opposite, to release the charged agent 410 (a chargeable agent after being charged). The heterocharge carried in the charged agent 410 is neutralized with the charge in the thunderstorm cloud, to achieve effect of consuming the charge in the thunderstorm cloud.

In some embodiments, as shown in FIG. 1 and FIG. 2, the rocket apparatus for changing an electrical environment in a thunderstorm cloud further includes: a corona probe 1 and a gravity gyroscope 6. The corona probe 1 is mounted on an outer portion of the rocket body. The gravity gyroscope 6 is mounted inside the rocket body. A signal output end of the corona probe 1 and a signal output end of the gravity gyroscope 6 are connected to the signal input end of the processing module 3. The corona probe 1 is preferably fastened to a top of the casing 11 of the rocket, and a rear end of the corona probe 1 is connected to a signal amplification and data processing circuit board. The corona probe 1 performs corona discharge in a strong electric field environment, and detects corona current strength, to obtain strength of the strong electric field environment based on a relationship between the corona current strength and the strength of the strong electric field environment. The gravity gyroscope 6 is configured to obtain a spin angular velocity of the rocket and an inclination attitude of the rocket.

In some embodiments, a wireless transmission module is disposed in the processing module 3, and the wireless transmission module is in wireless communication connection with a ground server.

In some embodiments, as shown in FIG. 1 and FIG. 2, the rocket apparatus for changing an electrical environment in a thunderstorm cloud further includes a triggering-lightning and discharge module 10. The triggering-lightning and discharge module 10 includes a pendant 101, a triggering-lightning and discharge conductor 102, and a release module configured to release the pendant 101. The pendant 101 is connected to a first end of the triggering-lightning and discharge conductor 102, and a second end of the triggering-lightning and discharge conductor 102 is connected to a first end of an insulated wire 103. A second end of the insulated wire 103 is fastened to the rocket body, and the pendant 101 is fastened to a bottom of the rocket body via the release module. The signal output end of the processing module 3 is connected to a signal input end of the release module. A purpose of using the insulated wire 103 is to electrically isolate/insulate the triggering-lightning and discharge conductor 102 from the rocket, to avoid triggering-lightning and discharge from directly hitting the rocket.

A high-strength clad copper wire is taken as the triggering-lightning and discharge conductor 102. An outer layer of the high-strength clad copper wire is a braided cladding material to ensure that tensile strength is not less than 100 N. An inner layer of the clad copper wire is an enameled copper wire, to ensure good electrical conductivity and corrosion resistance in a humid environment. A length of the triggering-lightning and discharge conductor 102 is 300 m, and a length of the insulated wire 103 for 50 m. The insulated wire 103 and the triggering-lightning and discharge conductor 102 are wound on a coil (a second end of the insulated wire 103 is fastened to the coil, the insulated wire 103 is wound first, and then the triggering-lightning and discharge conductor 102 is wound; and the triggering-lightning and discharge conductor 102 is released first, and then the insulated wire 103 is released). The coil may be rotationally mounted on a spool. The spool is made of an insulating material and mounted on a tail, and a tail end of the triggering-lightning and discharge conductor 102 is fastened to a 20g resistance pendant 101. In an initial state, the resistance pendant 101 is locked at a bottom of a tail piece with high-strength nylon wire. A local circuit is short-circuited based on a controllable electric signal, to instantly heat up and melt the nylon wire for unlocking. After being unlocked, the resistance pendant 101 stretches and unfolds the triggering-lightning discharging conductor 102 on the spool under action of gravity of the resistance pendant 101 and air resistance, to implement controllable triggering-lightning and discharge.

In some embodiments, as shown in FIG. 1 and FIG. 2, the rocket apparatus for changing an electrical environment in a thunderstorm cloud further includes: temperature, humidity sensor, and pressure sensors 5, where the temperature, humidity sensor, and pressure sensors 5 are mounted on the rocket body, and signal output ends of the temperature, humidity sensor, and pressure sensors 5 are connected to the signal input end of the processing module 3. The temperature, humidity, and pressure sensors 5 are mounted in an intermediate portion of the rocket body and configured to obtain meteorological elements such as an atmospheric temperature, humidity, and pressure on flight and landing trends of the rocket.

In some embodiments, as shown in FIG. 1 and FIG. 2, the rocket body includes a casing 11 and a rocket motor 9. A parachute opening control terminal 7, configured to control opening of a parachute 81, a parachute compartment 8, and the parachute 81 are disposed in the casing 11. The parachute 81 is mounted in the parachute compartment 8, and the signal output end of the processing module 3 is connected to a signal input end of the parachute opening control terminal 7. The parachute opening control terminal 7 controls the rocket to open the parachute 81 based on a controllable electrical signal. Because a descending speed of the rocket with the parachute 81 is much lower than an ascending speed of the rocket, the charged agent 410 is released while the rocket descends with the parachute 81, the charge in the thunderstorm cloud can be fully neutralized. To resolve a problem that "the rocket opens the parachute at a height above a top of the thunderstorm cloud, a descending trend of the rocket is uncontrollable, and the rocket is difficult to enter a target area", when arriving at the target area, the rocket may open the parachute to land based on an actual situation, to pointedly start the charge-neutralizing agent module 4.

Figure 5:
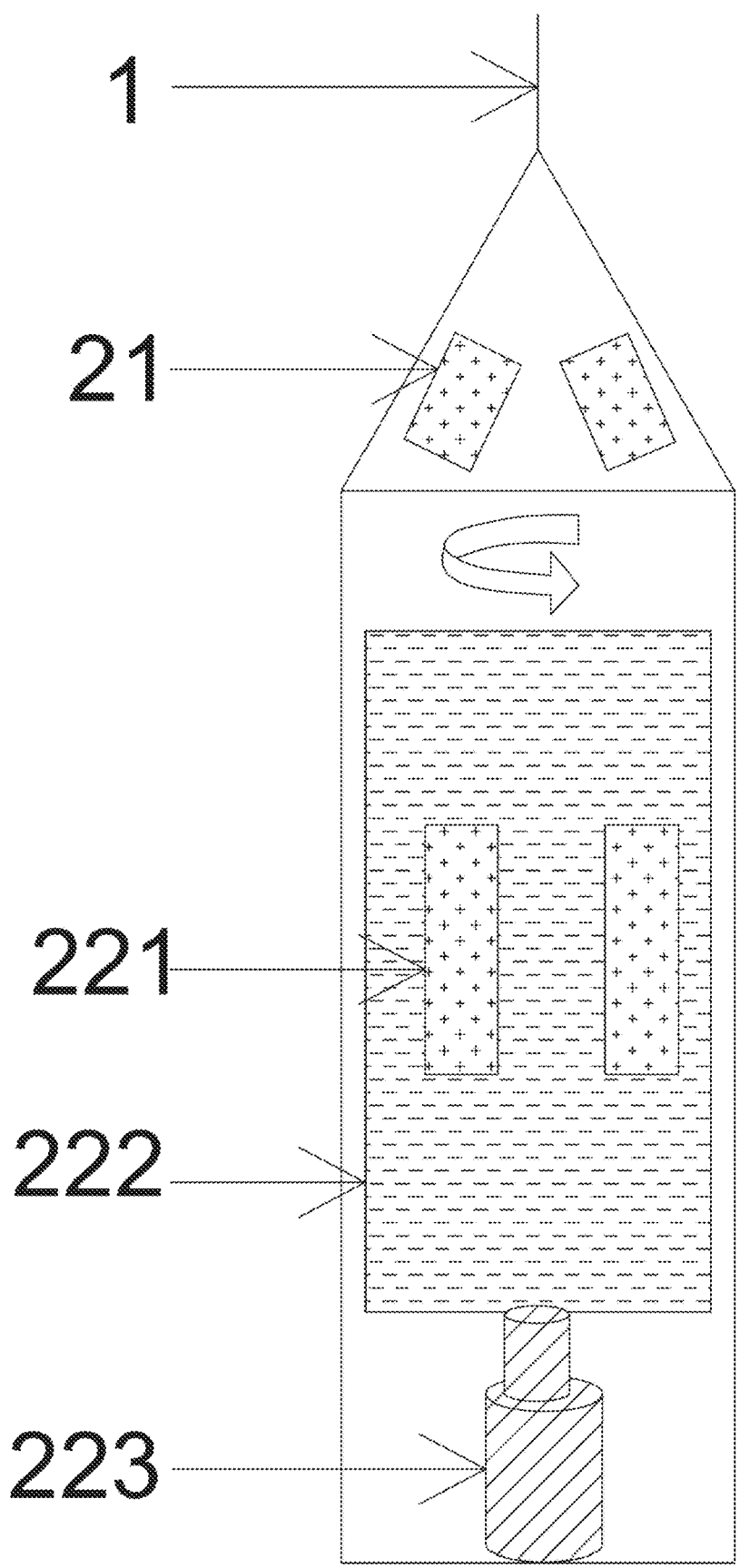
FIG. 5 is a schematic diagram of structures of a first atmospheric electric field detector and a second atmospheric electric field detector according to the present disclosure.
Figure 6:
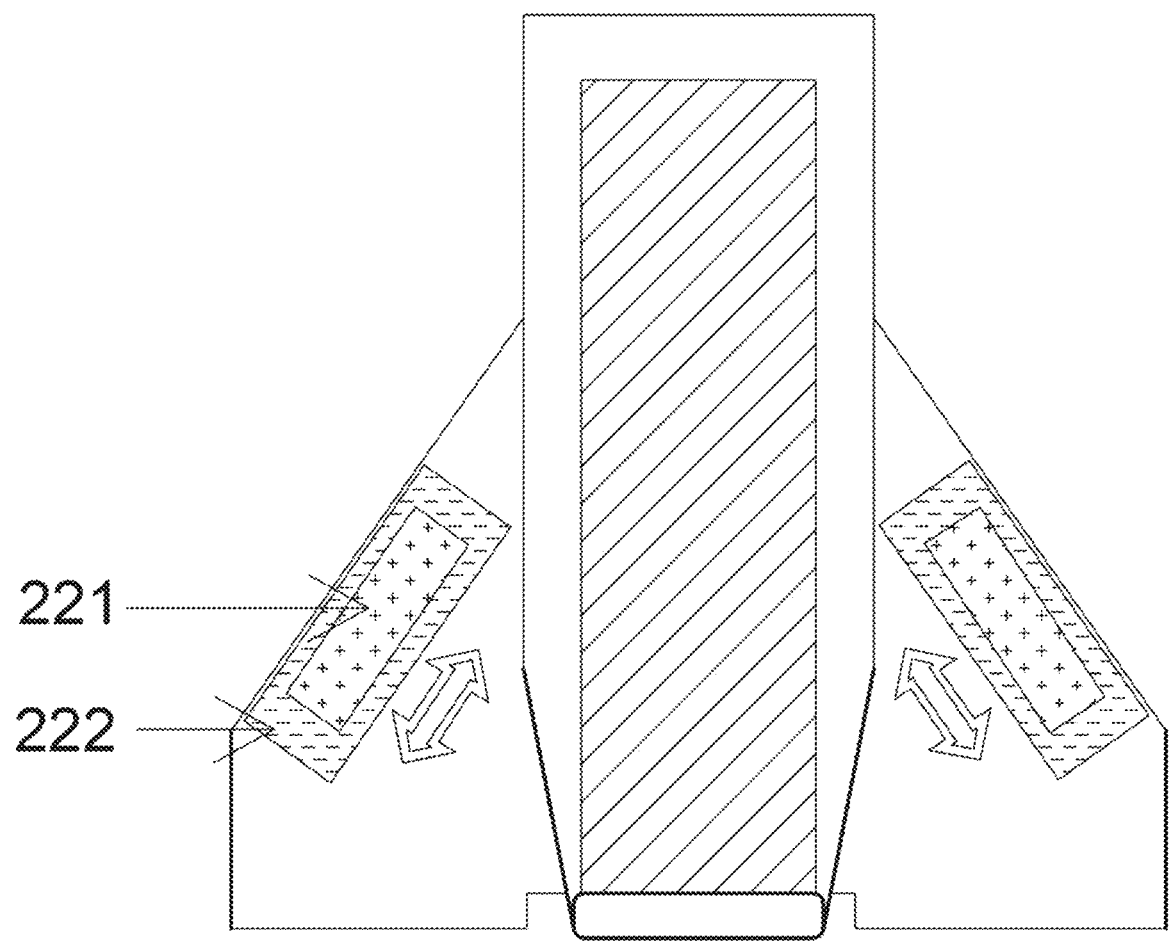
FIG. 6 is a schematic diagram of a structure of a third atmospheric electric field detector according to the present disclosure.

In some embodiments, as shown in FIG. 1 and FIG. 2, the atmospheric electric field detector includes: a first atmospheric electric field detector 21, a second atmospheric electric field detector 22, and a third atmospheric electric field detector 23. The first atmospheric electric field detector 21 is mounted on a head of the casing 11, the second atmospheric electric field detector 22 is mounted on an intermediate portion of the casing 11, and the third atmospheric electric field detector 23 is mounted on a tail of the casing 11. Four metallic electric field induction sheets 221 are separately disposed at 90° intervals in a head region of the casing 11, an intermediate region of the casing 11, and a tail region of the casing 11. There are two manners to enable the rocket to have a capability of analyzing electric field strength in an ascending phase of the rocket and a descending phase of the rocket with the parachute 81. Manner 1: In the ascending phase, the rocket spins, the electric field induction sheets 221 induce electric fields in different directions over time. A quantity of induced charges change, to generate a detectable current signal. A rear end of the rocket is connected to a signal amplification and data processing circuit board. The strength of the strong electric field environment is obtained through analysis based on the spin angular velocity of the rocket and the inclination attitude of the rocket that are provided by the gravity gyroscope 6. Manner 2: After the parachute 81 of the rocket is opened, the rocket descends slowly with the parachute 81, and a rotating state of the rocket body disappears. In this case, electric field shielding sheets 222 are activated to rotate (as shown in FIG. 5, structures of electric field shielding sheets 222 in the first atmospheric electric field detector 21 and the second atmospheric electric field detector 22 are fitted with structures of electric field induction sheets 221 in the first atmospheric electric field detector 21 and the second atmospheric electric field detector 22, a drive motor 223 drives the four electric field induction sheets 221 to rotate circumferentially, and air interfaces are disposed on the electric field shielding sheets 222, and the circumferentially-rotating electric field induction sheets 221 induce an external environment) or move back and forth (FIG. 6 shows the third atmospheric electric field detector 23, a motor may be used to drive four electric field induction sheets 221 in the third atmospheric electric field detector 23 to reciprocate, the motor is fitted with a reciprocating mechanism, to implement reciprocating driving of the electric field induction sheets 221, the electric field induction sheets 221 and the electric field shielding sheets 222 are overlapped cyclically, and the electric field induction sheets 221 may induce the external environment). The electric field induction sheets 221 are in a periodic and alternate state in the strong electric field environment and the electric field shielding sheets. The quantity of induced charges change, to generate the detectable current signal. The strength of the strong electric field environment is obtained through analysis based on the inclination attitude of the rocket that is provided by the gravity gyroscope 6, and angular velocities of rotations and reciprocating motions of the electric field shielding sheets 222.

A method for changing an electrical environment in a thunderstorm cloud includes the following steps.

S1: Launch a rocket into a thunderstorm cloud based on thunderstorm cloud detection data; make preparation or affecting an electrical environment in the thunderstorm cloud, preset a specific time for unfolding a triggering-lightning discharging conductor 102 and a time for releasing a charged agent 410, and perform determining based on ground detection data.

S2: After the rocket enters the thunderstorm cloud, a corona probe 1 performs corona discharge in a strong electric field environment, and detects corona current strength, to obtain strength of the strong electric field environment based on a relationship between the corona current strength and the strength of the strong electric field environment, where an atmospheric electric field detector operates and analyzes, based on spin angular velocity information of the rocket and inclination attitude information of the rocket that are provided by a gravity gyroscope 6, the strength of the strong electric field environment, to obtain accurate strength of a three-dimensional electric field and polarity of a charge in the thunderstorm cloud based on detection signals obtained by the corona probe 1 and the atmospheric electric field detector; detect parameters such as a temperature, a humidity, and a pressure; and return data to a ground server through a processing module 3.

S3: The charge-neutralizing agent module 4 externally releases based on the strength of the three-dimensional electric field and the polarity of the charge in the thunderstorm cloud, the charged agent 410 whose polarity is opposite to the charge in the thunderstorm cloud, to consume the charge in the thunderstorm cloud via neutralization between a heterocharge carried by the charged agent 410 and the charge in the thunderstorm cloud. A release module in a triggering-lightning and discharge module releases a pendant 101 at a preset time and position, stretches and unfolds a triggering-lightning and discharge conductor 102, to trigger inter-cloud discharge, cloud-to-ground discharge, or cloud-to-air discharge, and consume the charge in the thunderstorm cloud. A time of opening a parachute 81 is controlled based on the strength of the three-dimensional electric field and the polarity of the charge in the thunderstorm cloud.

S4: Determine, based on rocket detection data and ground detection data, whether a desired goal is achieved, where the desired goal is that density of local charges and electric field strength in a target region in the thunderstorm cloud are reduced below target values; if the desired goal is not achieved, further determine a follow-up operation plan based on the rocket detection data and the ground detection data, where the follow-up operation plan includes a launch direction of a rocket apparatus, a time and position of releasing the triggering-lightning and discharge conductor 102, and a time and position of releasing a charge-neutralizing agent; and repeat step S1 to step S4 until the desired goal is achieved.

FIG. 1 shows a locked state of a pendant 101 before launching. Referring to FIG. 2, after the rocket is launched, the rocket rises at a speed of 500 m/s and releases the triggering-lightning and discharge conductor 102 and the charged agent 410. A designed flight height of the rocket is 20 km. Therefore, the rocket can vertically traverse regions of the thunderstorm cloud at different heights. As shown in FIG. 3, after the parachute 81 is opened, the rocket descends at a speed of 8 m/s and releases the charged agent 410.

As shown in FIG. 1, a first atmospheric electric field detector 21, a second atmospheric electric field detector 22, the processing module 3, the charge-neutralizing agent module 4, temperature, humidity, and pressure sensors 5, the gravity gyroscope 6, a parachute opening control terminal 7, a parachute compartment 8, a rocket motor 9, and a controllable triggering-lightning and discharge module 10 are disposed in sequence from a head to a tail in the casing 11.

The above description is only preferred implementations of the present disclosure. It should be noted that those skilled in the art can make several improvements and modifications without departing from the technical principles of the present disclosure, and these improvements and modifications should also be construed as falling within the protection scope of the present disclosure.

What is claimed is:

1. A rocket apparatus for changing an electrical environment in a thunderstorm cloud, comprising:
    a rocket body;
    an atmospheric electric field detector;
    a charge-neutralizing agent module, configured to: generate and emit a positively/negatively charged agent, and neutralize a charge in the thunderstorm cloud;
    a controllable triggering-lightning and discharge module, configured to: trigger inter-cloud discharge, cloud-to-ground discharge, or cloud-to-air discharge, to consume the charge in the thunderstorm cloud; and
    a processing module, wherein a signal output end of the atmospheric electric field detector is connected to a signal input end of the processing module; a signal output end of the processing module is separately connected to a signal input end of the charge-neutralizing agent module and a signal input end of the controllable triggering-lightning and discharge module; and the atmospheric electric field detector, the charge-neutralizing agent module, the controllable triggering-lightning and discharge module, and the processing module are mounted on the rocket body;
    wherein the charge-neutralizing agent module comprises: agent compartments, charge compartments, fans, mesh plates, and a power supply and control assembly; the agent compartments are disposed on upper sides of the charge compartments, and the fans are mounted at first ends of the charge compartments and configured to blow air to second ends of the charge compartments: the mesh plates are mounted in the second ends of the charge compartments, and controllable sowing funnels are disposed at the second ends of the charge compartments; chargeable charge agents are placed in the agent compartments, controllable release funnels are disposed between the agent compartments and the charge compartments, and the controllable release funnels are disposed between the fans and the mesh plates; the power supply and control assembly is electrically connected to the mesh plates, and configured to positively and negatively polarize the mesh plates; and the signal output end of the processing module is connected to a signal input end of the power supply and control assembly, and a signal output end of the power supply and control assembly is separately connected to signal input ends of the controllable sowing funnels, signal input ends of the controllable release funnels, and signal input ends of the fans.

2. The rocket apparatus for changing an electrical environment in a thunderstorm cloud according to claim 1, wherein there are two agent compartments, two charge compartments, two fans, two mesh plates, two controllable release funnels, and two controllable sowing funnels, the two agent compartments and the two charge compartments are disposed in a same vertical direction, the two agent compartments are spaced apart, and the two mesh plates are respectively a positively polarized mesh plate and a negatively polarized mesh plate.

3. The rocket apparatus for changing an electrical environment in a thunderstorm cloud according to claim 1, further comprising:
    a corona probe and a gravity gyroscope, wherein the corona probe is mounted on an outer portion of the rocket body, the gravity gyroscope is mounted inside the rocket body, and a signal output end of the corona probe and a signal output end of the gravity gyroscope are connected to the signal input end of the processing module.

4. The rocket apparatus for changing an electrical environment in a thunderstorm cloud according to claim 1, wherein a wireless transmission module is disposed in the processing module, and the wireless transmission module is in wireless communication connection with a ground server.

5. The rocket apparatus for changing an electrical environment in a thunderstorm cloud according to claim 1, wherein the controllable triggering-lightning and discharge module comprises:
    a pendant, a triggering-lightning and discharge conductor, and a release module configured to release the pendant, the pendant is connected to a first end of the triggering-lightning and discharge conductor, a second end of the triggering-lightning and discharge conductor is connected to a first end of an insulated wire, a second end of the insulated wire is fastened to the rocket body, the pendant is fastened to a bottom of the rocket body via the release module, and the signal output end of the processing module is connected to a signal input end of the release module.

6. The rocket apparatus for changing an electrical environment in a thunderstorm cloud according to claim 1, further comprising:
temperature, humidity, and pressure sensors, wherein the temperature, humidity, and pressure sensors are mounted on the rocket body, and signal output ends of the temperature, humidity, and pressure sensors are connected to the signal input end of the processing module.

7. The rocket apparatus for changing an electrical environment in a thunderstorm cloud according to claim 3, wherein the rocket body comprises:
a casing and a rocket motor; a parachute opening control terminal configured to control opening of a parachute, a parachute compartment, and the parachute are disposed in the casing; the parachute is mounted in the parachute compartment; and the signal output end of the processing module is connected to a signal input end of the parachute opening control terminal.

8. The rocket apparatus for changing an electrical environment in a thunderstorm cloud according to claim 7, wherein the atmospheric electric field detector comprises: a first atmospheric electric field detector, a second atmospheric electric field detector, and a third atmospheric electric field detector, the first atmospheric electric field detector is mounted on a head of the casing, the second atmospheric electric field detector is mounted on an intermediate portion of the casing, and the third atmospheric electric field detector is mounted on a tail of the casing.

* * * * *